(12) United States Patent
Liu et al.

(10) Patent No.: US 8,111,112 B2
(45) Date of Patent: Feb. 7, 2012

(54) SEMICONDUCTOR DEVICE AND METHOD OF FORMING COMPACT COILS FOR HIGH PERFORMANCE FILTER

(75) Inventors: Kai Liu, Phoenix, AZ (US); Robert Charles Frye, Piscataway, NJ (US)

(73) Assignee: STATS ChipPAC, Ltd., Singapore (SG)

( * ) Notice: Subject to any disclaimer, the term of this patent is extended or adjusted under 35 U.S.C. 154(b) by 130 days.

(21) Appl. No.: 12/705,790

(22) Filed: Feb. 15, 2010

(65) Prior Publication Data
US 2010/0140738 A1 Jun. 10, 2010

Related U.S. Application Data

(63) Continuation of application No. 11/734,410, filed on Apr. 12, 2007, now Pat. No. 7,688,160.

(51) Int. Cl.
| H03H 7/00 | (2006.01) |
|---|---|
| H01H 85/02 | (2006.01) |
| H01L 27/08 | (2006.01) |

(52) U.S. Cl. ......... 333/185; 333/177; 336/232; 257/531
(58) Field of Classification Search ................... 333/185, 333/181, 167, 177; 336/200, 232; 257/531; 29/602.1
See application file for complete search history.

(56) References Cited

U.S. PATENT DOCUMENTS

| 5,990,677 | A | * | 11/1999 | Goldfine et al. | ............... 324/239 |
| 6,060,976 | A | * | 5/2000 | Yamaguchi et al. | .......... 336/200 |
| 6,304,156 | B1 | | 10/2001 | Ishizaki et al. | |
| 6,414,567 | B2 | | 7/2002 | Matsumura et al. | |
| 6,993,313 | B2 | | 1/2006 | Castillejo et al. | |
| 7,116,202 | B2 | | 10/2006 | Alexopoulos et al. | |
| 7,183,625 | B2 | | 2/2007 | Hsieh | |
| 7,253,712 | B1 | | 8/2007 | Papananos | |
| 7,696,603 | B2 | | 4/2010 | Beach | |
| 7,719,083 | B2 | * | 5/2010 | Chang | ........................... 257/531 |
| 7,754,606 | B2 | | 7/2010 | Paul et al. | |
| 7,838,384 | B2 | | 11/2010 | Cho et al. | |
| 2005/0068146 | A1 | | 3/2005 | Jessie | |
| 2006/0220773 | A1 | | 10/2006 | Su et al. | |

* cited by examiner

Primary Examiner — James Cho
(74) Attorney, Agent, or Firm — Robert D. Atkins; Patent Law Group: Atkins & Associates, P.C.

(57) ABSTRACT

A semiconductor device has a first coil structure formed over the substrate. A second coil structure is formed over the substrate adjacent to the first coil structure. A third coil structure is formed over the substrate adjacent to the second coil structure. The first and second coil structures are coupled by mutual inductance, and the second and third coil structures are coupled by mutual inductance. The first, second, and third coil structures each have a height greater than a skin current depth of the coil structure defined as a depth which current reduces to 1/(complex permittivity) of a surface current value. In the case of copper, the coil structures have a height greater than 5 micrometers.

The first, second, and third coil structures are arranged in rounded or polygonal pattern horizontally across the substrate with a substantially flat vertical profile.

24 Claims, 7 Drawing Sheets

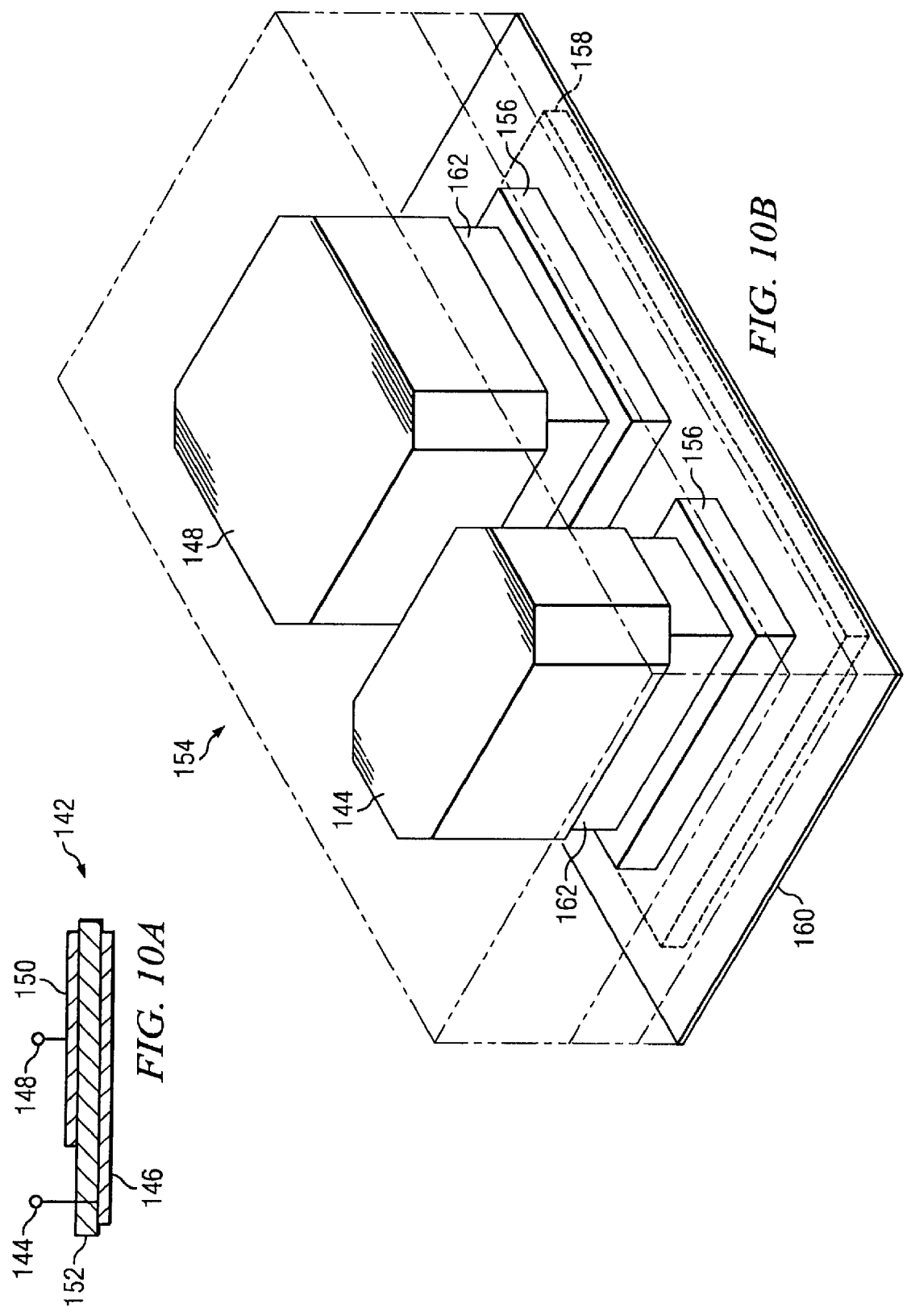

SEMICONDUCTOR DEVICE AND METHOD OF FORMING COMPACT COILS FOR HIGH PERFORMANCE FILTER

CLAIM TO DOMESTIC PRIORITY

The present application is a continuation of U.S. patent application Ser. No. 11/734,410, now U.S. Pat. No. 7,688,160, filed Apr. 12, 2007, and claims priority to the foregoing parent application pursuant to 35 U.S.C. §120.

FIELD OF THE INVENTION

The present invention relates in general to electronic devices and, more particularly, to a semiconductor device and method of forming compact coils for a high performance filter.

BACKGROUND OF THE INVENTION

Electrical components, such as inductors, capacitors, computer chips, and the like, are increasingly in demand for a broad range of applications. Along with an increased overall need for these components has been a drive to make the components more miniaturized in size and footprint. Smaller electrical components carry through to smaller electrical devices, such as telephones and portable music player devices.

Electrical devices known as filters/diplexers are typically comprised of lumped LC networks or distributed-line resonators. The inductor components in typical LC type circuits are not magnetically coupled. Moreover, the size of such inductor components is usually large, particularly for low-frequency applications such as a Global System for Mobile communications (GSM) implementation in devices such as mobile phones.

Distributed-line topologies require the length of the respective "line" to be in the order of one-fourth (¼) of the wavelength at the operating frequency. As a result, line length requirements also limit a low frequency application for distributed-line topologies.

A need exists for an inductive component that realizes a compact design yet is usable in low-frequency applications. The design would benefit from compatibility with existing semiconductor technologies that allow for integration of electrical components in semiconductor devices.

SUMMARY OF THE INVENTION

Accordingly, in, one embodiment, the present invention is a method of forming a semiconductor device comprising the steps of providing a substrate, forming a first coil structure over the substrate, forming a second coil structure over the substrate adjacent to the first coil structure, and forming a third coil structure over the substrate adjacent to the second coil structure. The first, second, and third coil structures each have a height greater than a skin current depth of the coil structure defined as a depth which current reduces to 1/(complex permittivity) of a surface current value.

In another embodiment, the present invention is a method of forming a semiconductor device comprising the steps of providing a substrate, forming a first coil structure over the substrate, and forming a second coil structure over the substrate adjacent to the first coil structure. The first and second coil structures each have a height greater than a skin current depth of the coil structure.

In still another embodiment, the present invention is a method of forming a semiconductor device comprising the steps of providing a substrate, forming a first coil structure over the substrate, and forming a second coil structure over the substrate adjacent to the first coil structure. A first end of the first coil structure is placed 90 degrees from a first end of the second coil structure.

In still another embodiment, the present invention is a semiconductor device comprising a substrate and first coil structure formed over the substrate. A second coil structure is formed over the substrate adjacent to the first coil structure. The first and second coil structures each have a height greater than a skin current depth of the second coil structure.

BRIEF DESCRIPTION OF THE DRAWINGS

FIG. 10A illustrates a conceptual depiction of a capacitor device in a side-view;

FIG. 10B illustrates a three-dimensional view of a capacitor device incorporated into a filter device;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
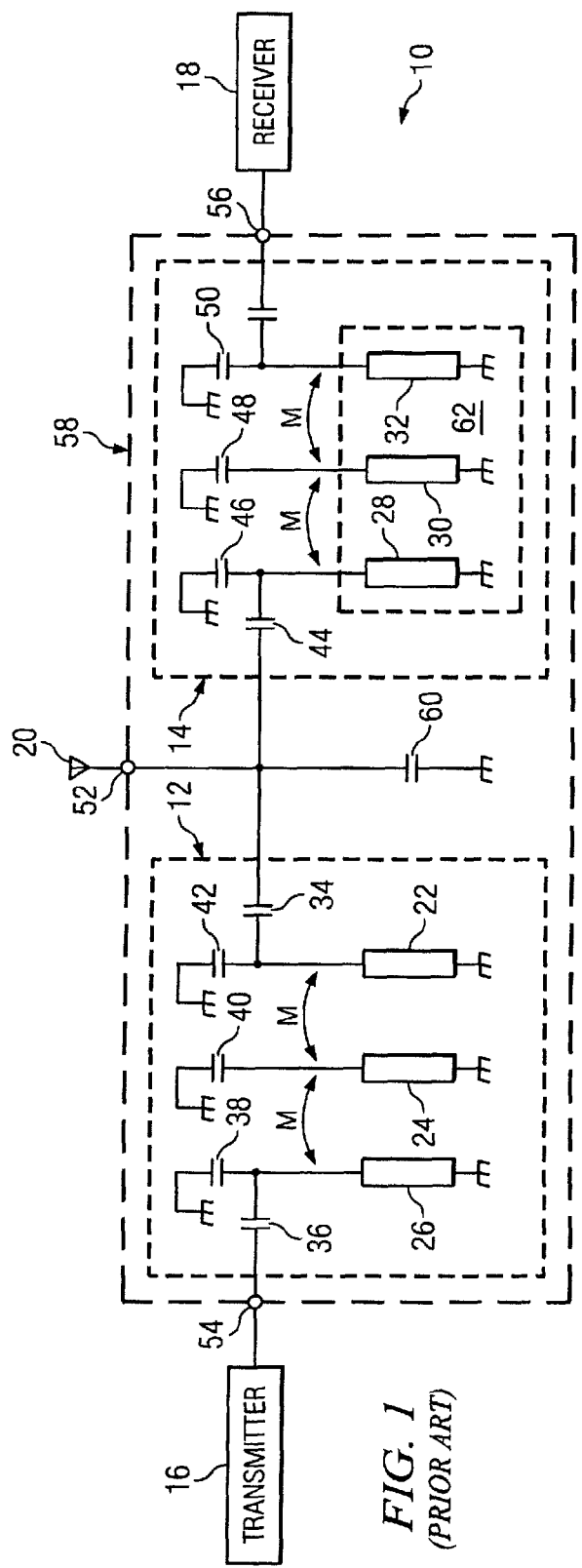
FIG. 1 illustrates an exemplary prior art diplexer topology using distributed lines.

Turning to FIG. 1, an exemplary diplexer topology 10 of the prior art is shown incorporating a distributed lines methodology. A comb-line transmission filter 12 and a comb-line reception filter 14 are coupled to a transmitter 16 and receiver 18, respectively, and an antenna 20 as shown through electrodes 54 and 56. Transmission filter 12 includes three strip line resonators 22, 24, and 26. Likewise, reception filter 14 includes three strip line resonators 28, 30, and 32 as shown.

A coupling capacitor 34 is formed between a coupling electrode and a strip line resonator electrode, and is electrically connected to the antenna 20 through an antenna terminal 52. Likewise, coupling capacitor 44 is positioned as shown in the reception filter 14. The strip line resonators are lowered in resonance frequency by loading capacitors 38, 40, 42, 46, 48, and 50. The strip line resonators 22, 24, and 26 are magnetically coupled 62 as shown.

Because topology 10 uses a distribution-line methodology to perform the filtering functionality, it is limited in low-frequency (e.g., less than 2 gigahertz) applications, due to the previously described line length requirement which adds size to the component as the operating frequency of the respective device moves lower.

Figure 2:
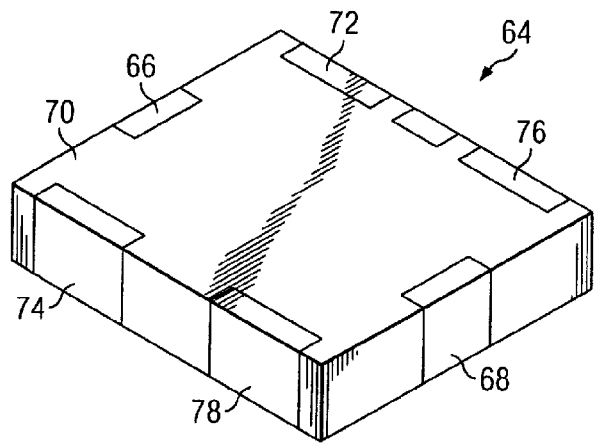

FIG. 2 shows an exemplary diplexer topology 64 of the prior art to illustrate incorporating the alternative, lumped LC circuit components methodology. A laminate 70 has a transmitter terminal electrode 66 and a receiver terminal electrode 68 provided on the left and right ends, respectively. An antenna terminal electrode is shown positioned between grounding terminal electrodes 72 and 76, which are provided on the rear surface of the laminate 70. Grounding terminal electrodes 74 and 78 are provided on the front surface.

Figure 3:
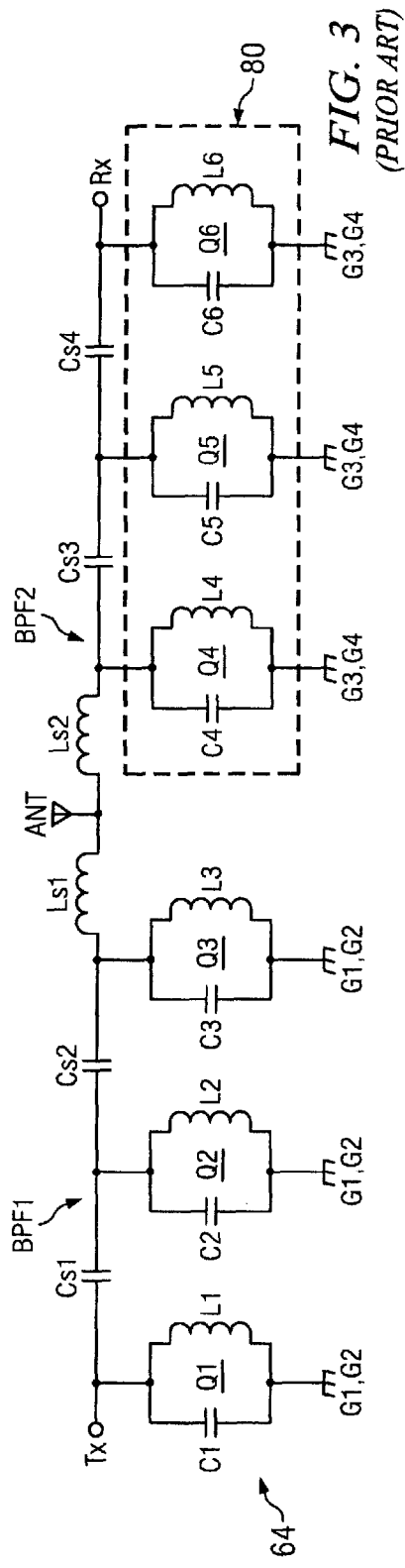
FIGS. 2 and 3 illustrate an exemplary prior art diplexer topology using lumped LC circuits.

FIG. 3 shows an electrical circuit equivalent to the prior art laminated type duplexer topology 64 shown in FIG. 2 comprising two band pass filter components (e.g., BPF1 and BPF2). Each band pass filter incorporates nine (9) LC components (e.g., C1, L1; C2, L2; etc.). While the topology 64 can be used in lower frequency applications, the size and footprint of the respective topology are again prohibitively large. Further, inductor subcomponents L1, L2, L3, L4, L5, and L6 are not magnetically coupled.

The present invention achieves a compact design which would normally be larger in size using a conventional technique as found in either of the described lumped LC or distributed-line prior art implementations. A series of tube structures is deposited on a substrate and formed into a coil structure. The coil structures can be adapted in various ways to suit a particular application. The coil structures can be easily integrated with other miniaturized electrical components such as capacitor devices using substrates, as will be seen, to perform the filtering and diplexing functionality previously seen in the prior art but using a much smaller size and footprint.

A series of coil structures can be used for designs of integrated passive devices (IPD) that use silicon and semiconductor technologies as will be described. Individual coil structures can be combined into a series of integrated coil structures. A series of coil structures can include two, three, four or more single coil structures. The integrated coil structures form spiral inductor devices which are magnetically coupled together. Beyond the inductive property from a single coil structure, a series of integrated coil structures has an associated mutual inductance which helps to realize a more compact design. In addition, the coil structures are efficient and cost-effective to manufacture.

Figure 4:
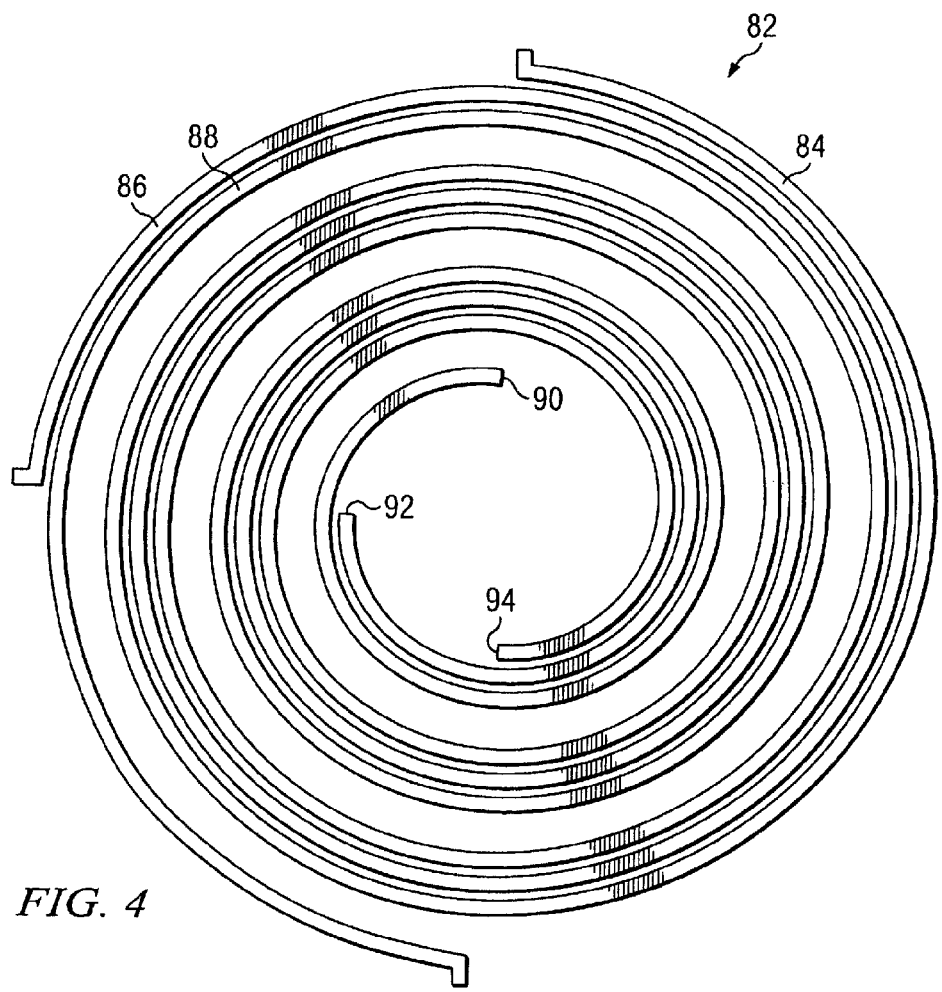
FIG. 4 illustrates an exemplary coil structure.

Turning to FIG. 4, a conceptual diagram of a plurality of coil structures 82 is shown. Three coil structures are depicted, but again, two, three, or more coil structures can be realized in any given implementation. Coil structures 84, 86, and 88 are formed by depositing metal tube-like structures over a substrate.

The metal tube-like structures, or "tubes" can be arranged in the round shape as shown. Additionally, the tubes can be configured in other geometrical patterns, such as an octagonal geometrical design, to suit a particular need. The tube structures can have a square, round, or rectangular cross section. In one embodiment, the tube structures are comprised of a copper (Cu) or copper alloy metal material, although additional metals and metal alloy materials can be utilized as required. The tubes can be deposited in a metallization process, accordingly, the tube structures can also be referred to as "metallizations." The coil structures 82 are magnetically coupled to each other.

Coils 84, 86, and 88 include respective ends 90, 92, and 94 which can be adapted to provide an electrode-like function. Ends 90, 92, and 94 can be positioned as shown. In the present illustration, the coil 86 having end 92 is rotated ninety (90) degrees with respect to the coil 84 having end 90. Similarly, coil 88 having end 94 is rotated ninety (90) degrees with respect to the coil 86 having end 92, and one-hundred eighty (180) degrees in respect to the coil 84 having end 90.

The coils 84, 86, and 88 can be rotated similarly having degrees of angle between 0 and 360 degrees in various embodiments. In other words, the coils 84, 86, and 88 can be in any degree of angle with respect to another coil. Again, any number of coils (e.g., 2, 3, 4 or above) can be combined in a variety of embodiments.

Figure 5:
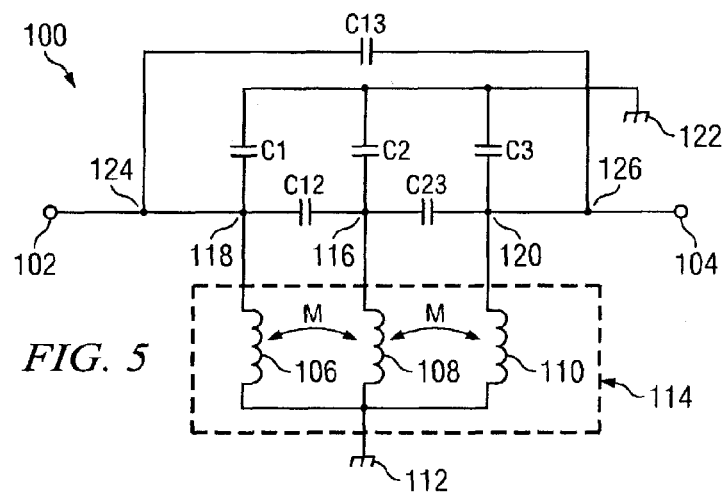
FIG. 5 illustrates a schematic of an exemplary filter device incorporating a coil structure.

Turning to FIG. 5, a schematic diagram of a filter device 100 incorporating a plurality of coil structures is depicted. The device 100 consists of six (6) capacitors and three (3) compact coil structures. A first capacitor (C13) is coupled between an input terminal 102 and an output terminal 104. Coils 106, 108, and 110 are coupled to ground 112 at a first end. Again, the coils 106, 108, and 110 are magnetically coupled as illustrated by dotted line 114. Capacitors C1, C2, and C3 are coupled to coils 106, 108, and 110 at nodes 116, 118, and 120, and coupled to ground 122 as shown. Finally capacitors C12 and C23 are coupled in series between nodes 118 and 120 as depicted. C13 is coupled between the input terminal 102 and output terminal 104 at nodes 124 and 126, as shown.

In one embodiment, the capacitance of C1, C2, and C3 is 1 picofarad (pF), while the capacitance of C12 and C23 are 10 picofarads (pF) and the capacitance of C13 is 2.62 picofarads (pF). As one skilled in the art would anticipate, however, the capacitance of the depicted capacitors can be varied in any respect to suit a particular application and provide an appropriate filter response.

Figure 6:
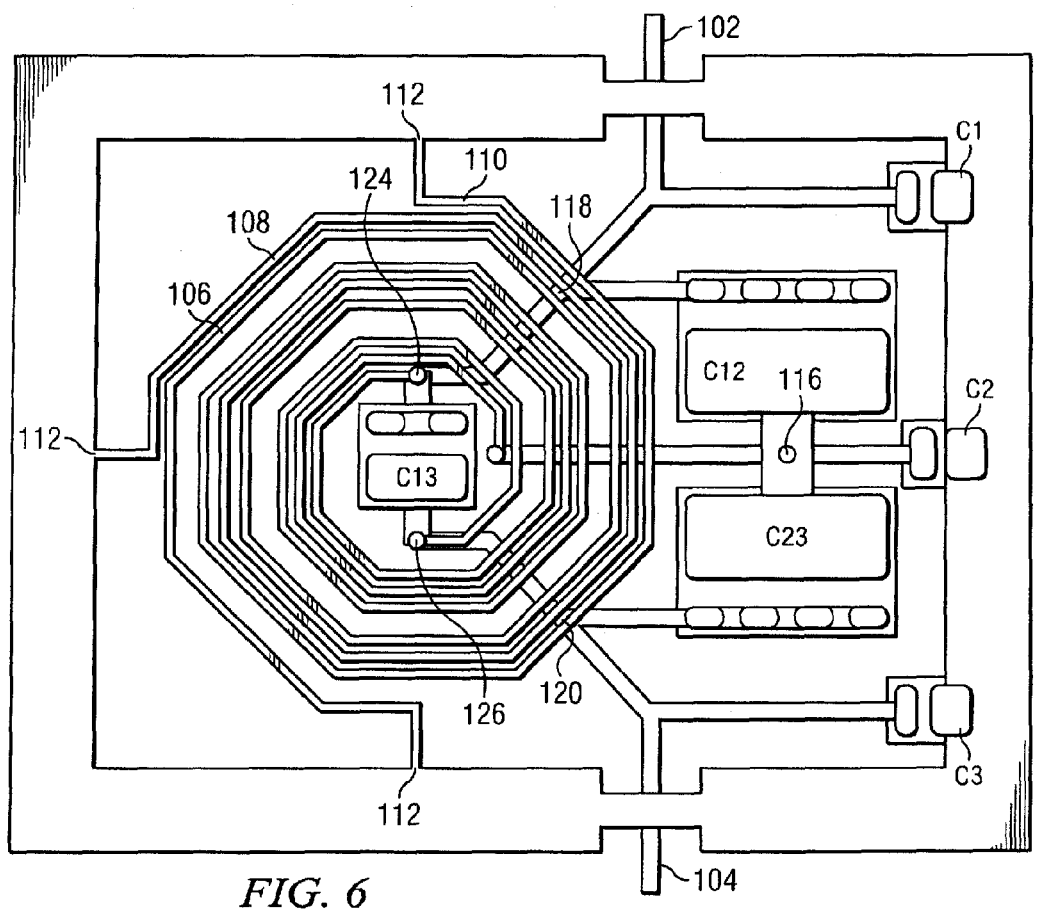
FIG. 6 illustrates an exemplary layout of a filter device incorporating a coil structure and a plurality of capacitor devices deposited over a substrate.

FIG. 6 illustrates a filter device incorporating an embodiment of the coil structure of the present invention in a layout view. The various subcomponents depicted share the appropriate figure numbers from FIG. 5, including an input terminal 102 and output terminal 104. Coils 106, 108, and 110 are positioned as shown. A portion of coil 106 is positioned interiorly to coil 108. Similarly, a portion of coil 108 is positioned interiorly to coil 110. Again, the coils 106, 108, and 110 are magnetically coupled.

Coils 106, 108, and 110 are each coupled to a ground bar 112 as shown at a first end. Capacitors C12 and C23 are coupled together through node 116. Similarly, capacitors C1, C2, and C3 are coupled between the ground bar 112 and nodes 116, 118, and 120. Nodes 124 and 126 are coupled as shown between capacitor C13 and input 102 and output 104.

Figure 7:
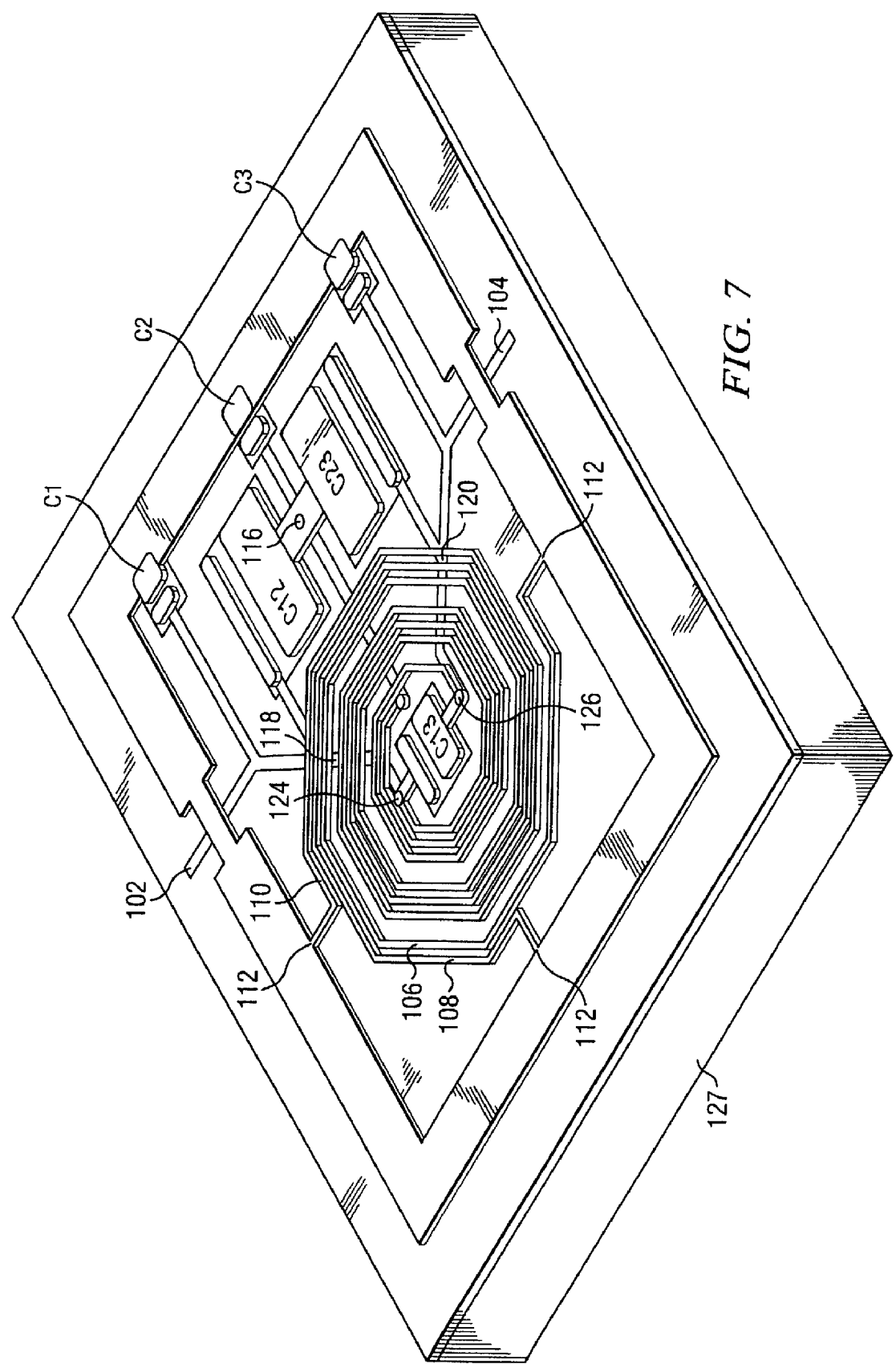
FIG. 7 illustrates the layout depicted in FIG. 6 in a three-dimensional view.

Coils 106, 108, 110, as well as the various capacitors, leads, and ground bar structures are deposited over and extend horizontally across a substrate, while maintaining a substantially flat vertical profile. FIG. 7 illustrates the layout shown in FIG. 6 in a three-dimensional view. Here again, the respective figure numbers from FIGS. 5 and 6 are shown. Input terminal 104, connecting leads to the various capacitors (e.g., capacitor C12), and output terminal 104 are deposited over the substrate 127. Coils 106, 108, and 110, ground bar 112, and the various capacitor structures are deposited over the terminals 102 and 104 and connecting leads. Coils 106, 108, and 110 extend horizontally across substrate 127 as shown.

As previously described, coils 106, 108, and 110 can form an inductive device which is consistent with other so-called "integrated passive devices" (IPD). A wide variety of the passive devices such as an inductor or filter device, but also including resistors, capacitors, BALUNs, transceivers, receivers, and other interconnects are placed on a substrate such as substrate 127. The substrate 127 can include silicon, glass, laminate, or ceramic materials.

Integration of an inductor or filter device as described results in a high performance system level solution, which provides a significant reduction in die size, weight, number of interconnections and system board space requirements, and can be used for many applications.

A wide variety of filter designs can be constructed which include coils 106, 108, 110 to suit particular applications. The filter designs can be based on differing technologies, including silicon, printed circuit board (PCB) (laminate) or low temperature co-fired ceramic (LTCC) technologies. Again, as a result, substrate 127 can include materials such as silicon or silicon-like materials, laminate materials, glass and ceramic materials.

Coils 106, 108, and 110, as well as filter device 100 and accompanying subcomponenty can be constructed using materials, techniques, and manufacturing equipment known in the art, including various thin-film deposition methods and techniques and incorporating the use of known manufacturing tools and equipment.

Figure 8:
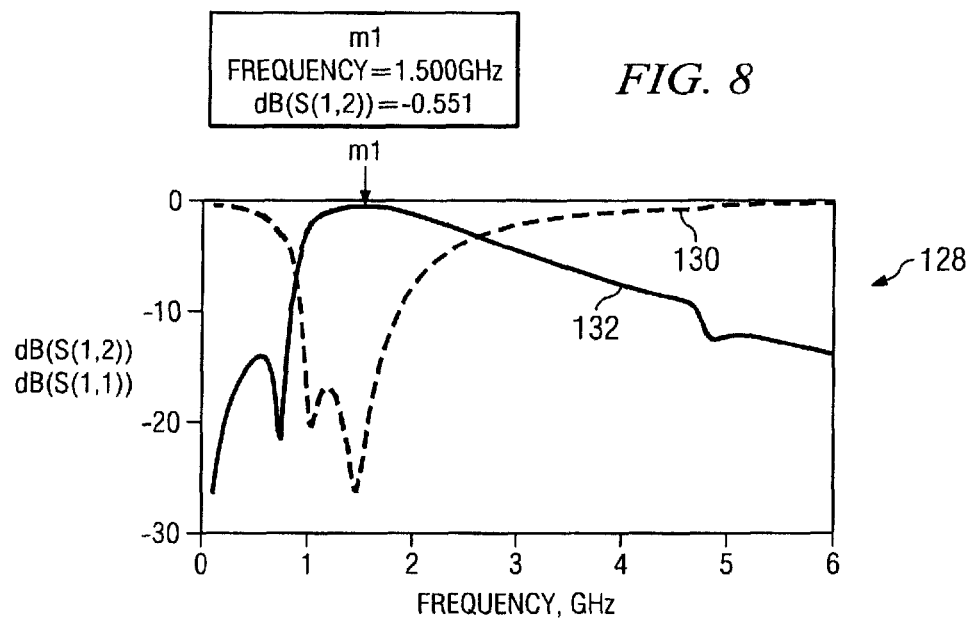
FIG. 8 illustrates an exemplary electromagnetic (EM) response of the filter device depicted in FIGS. 6 and 7.

Turning to FIG. 8, an exemplary electromagnetic (EM) response curve 128 for a filter device 100 incorporating coils 106, 108, and 110, is depicted. FIG. 8 illustrates a band pass filter (BPF) performance in the 1.5 GHz band, where a control signal 130 and filtered signal 132 are depicted.

As one skilled in the art would expect, filtered signal 132 is attenuated outside of the band pass range. Further, one skilled in the art will appreciate that a wide range of frequency curves having different rejection levels can be achieved by adjustment of the various capacitor devices of filter 100.

Figure 9A:
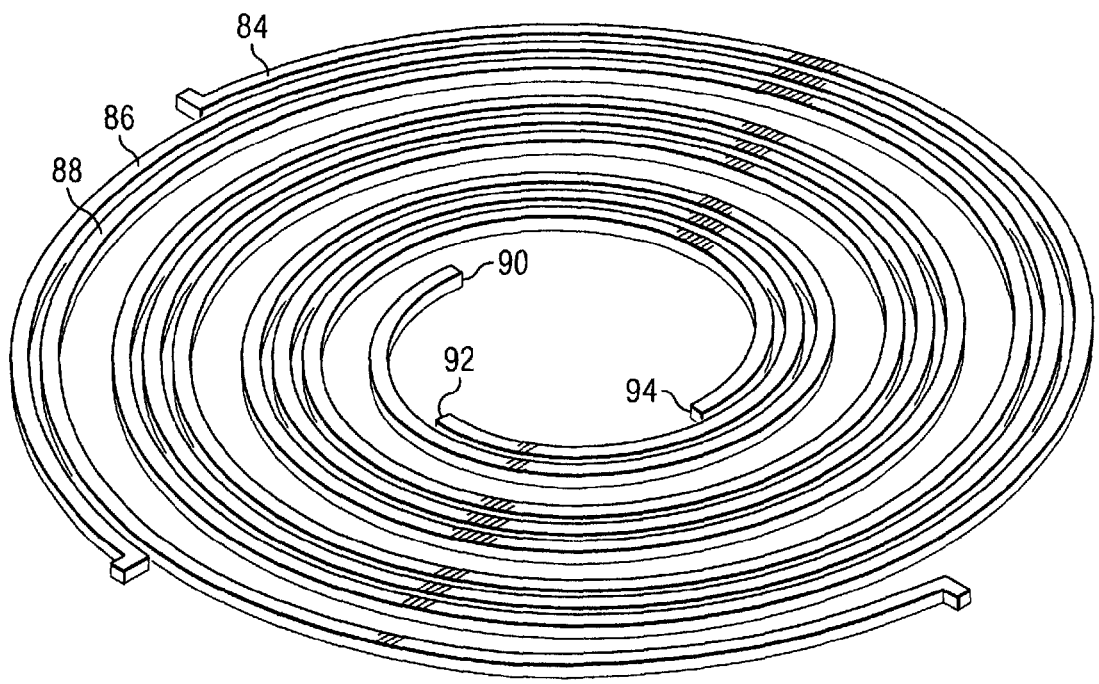
FIGS. 9A and 9B illustrate an exemplary coil structure, including exemplary dimensions.
Figure 9B:
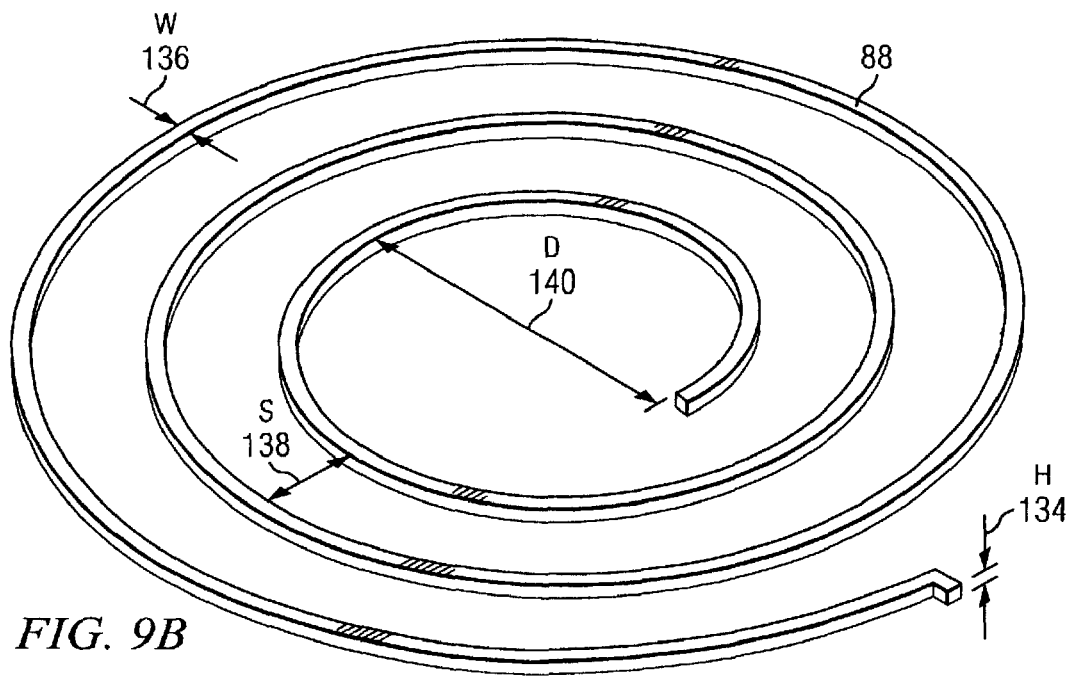

FIGS. 9A and 9B further illustrate the coil structures in a three-dimensional view. Again, coils 84, 86 and 88 are shown, having electrodes 90, 92, and 94 which are oriented at 90 degree angles. FIG. 9B illustrates various dimensional aspects of coil structure 88, including height (H) 134, width (W) 136, coil spacing (S) 138, and inner opening diameter (d) 140.

When an electromagnetic wave interacts with a conductive material, mobile charges within the material are made to oscillate back and forth with the same frequency as the impinging fields. The movement of these charges, usually electrons, constitutes an alternating electric current, the magnitude of which is greatest at the conductor's surface. The decline in current density versus depth is known as the "skin effect."

So-called "skin depth" is a measure of the distance over which the current falls to 1/e of its original value. A gradual change in phase accompanies the change in magnitude, so that, at a given time and at appropriate depths, the current can be flowing in the opposite direction to that at the surface.

The skin depth is a property of the material that varies with the frequency of the applied wave. A respective skin depth can be calculated from the relative permittivity and conductivity of the material and frequency of the wave. First, the material's complex permittivity, $\epsilon_c$ is found such that $$\varepsilon_c = \varepsilon\left(1 - j\frac{\sigma}{\omega\varepsilon}\right) \quad (1)$$

where:
$\epsilon$=permittivity of the material of propagation,
$\omega$=angular frequency of the wave, and
$\sigma$=electrical conductivity of the material of propagation.

In one embodiment, to overcome the skin effect and minimize metal loss, a respective thickness of the coil structures 84, 86, and 88 is maintained to be larger than the respective skin depth.

Again, in one embodiment, copper (Cu) is utilized as a metal material for coil 88. A thickness of eight (8) micrometers exceeds the skin depth for copper (taking into account the electrical conductivity of the copper metal). A thickness greater than five (5) micrometers is recommended, with, again, a preferable thickness of eight (8) micrometers.

The total length of coil 88 is related to the operating frequency of coil 88. In one embodiment, the coil width 136 is eight (8) micrometers. The coil height 134 is also eight (8) micrometers. The coil spacing 140 is eighty (80) micrometers. The number of turns (T) is three (3). The inner opening diameter 140 is 240 micrometers. Total area is approximately 0.7×0.7=0.49 mm$^2$. The estimated inductance for the coil 88 is estimated to be approximately 6.5 nanohenrys (nH).

Again, as one skilled in the art would anticipate, the various dimensions of coil 88, as well as coils 86, and 84 can be optimized using tools such as a computer program to suit differing space requirements and/or differing specification requirements.

FIG. 10A illustrates the concept of a thin film capacitor design which is integrated with the present invention in one embodiment. Terminal electrodes 144 and 148 are located on a top portion of the device 142. A first thin metal or metal or metal alloy material 146 is separated by a dielectric material 152 and forms the bottom capacitor plate 146. A top capacitor plate structure 150 is deposited above the dielectric 152.

FIG. 10B illustrates a thin film capacitor device 154 which can be deposited over a substrate 160 and coupled to coils 106, 108, or 110. Capacitor 154 includes the top electrodes 144 and 148, which are deposited over the top capacitor plate 156. A dielectric material 152, which is thin relative to the top capacitor plate 156 and thereby not illustrated for conceptual purposes, separates the plate 156 from the bottom plate 158.

Figure 10C:
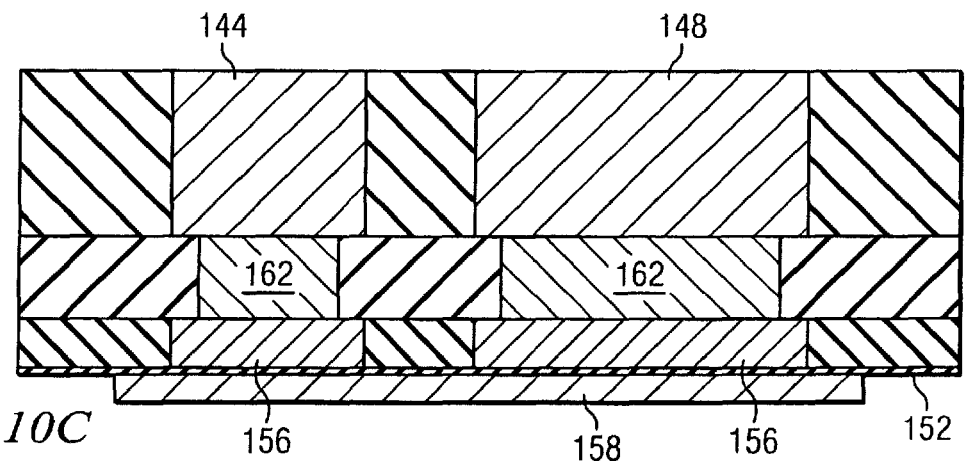
FIG. 10C illustrates a side view of the capacitor device of FIG. 10B.

FIG. 10C illustrates the capacitor device 154 in a side view, with the substrate 160 removed for purposes of illustration. In Example A manufacturing technique, the bottom capacitor plate 158 is deposited over the substrate 160. A thin-film dielectric 152 is deposited over the bottom plate 158. The top capacitor plate 156 is then deposited over the dielectric material 152.

An additional layer is formed over the top plate 156 to provide structural support. A first via 162 allows for electrical connectivity between the bottom electrode 144 and the bottom plate 158. Electrodes 144 and 148 are then formed. As one skilled in the art will expect, coils 106, 108 and 110 can be deposited consistent with Example A manufacturing technique at an appropriate step in the deposition processes.

Figure 10D:
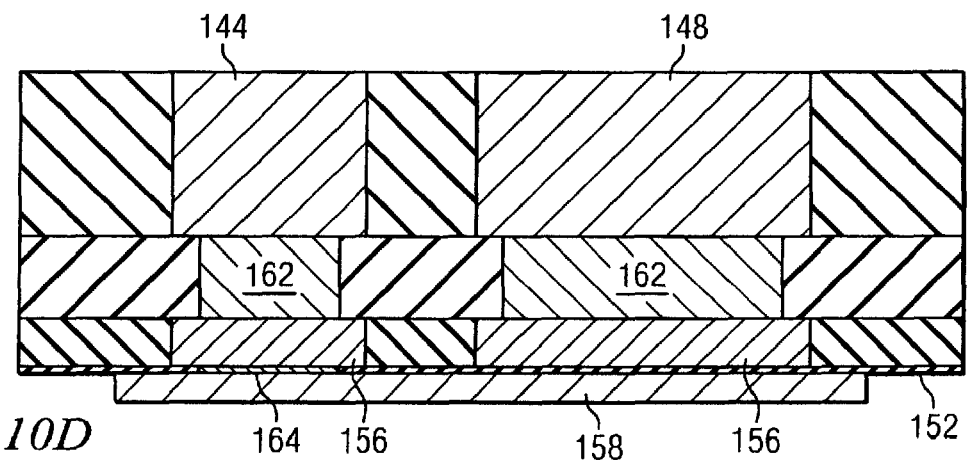
FIG. 10D illustrates a larger side view of the capacitor device of FIG. 10B.

FIG. 10D illustrates the exemplary side view depiction of FIG. 10C in a larger sense, and includes the second view via structure 164 which allows electrical connectivity from electrode 144 through via 162, through plate 156 and via 164 to bottom plate 158.

In one embodiment, exemplary dimensions can include one (1) micrometer in thickness for bottom plate 158. Via 164 can be 0.2 um thick. The thin-film dielectric can also be 0.2 um thick. Top plate 156 can be 2 um thick. Via 162 can be 3 um in thickness. Finally, electrodes 144 and 148 can be 8 um in thickness. Again, however, as one skilled in the art will appreciate, various additional and differing thicknesses can be achieved for specific applications and implementations.

Coil structures such as coils 106, 108, and 110 in implementations over a substrate as depicted can provide conventional filtering and diplexing functionality in a dramatically decreased size and footprint.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of forming a semiconductor device, comprising:
   providing a substrate having a surface;
   forming a first coil structure over the surface of the substrate, the first coil structure having a height greater than a skin current depth of the first coil structure defined as a depth which current reduces to 1/(complex permittivity) of a surface current value;
   forming a second coil structure over the surface of the substrate adjacent to the first coil structure in a plane parallel to the surface of the substrate, the second coil structure having a height greater than a skin current depth of the second coil structure defined as a depth which current reduces to 1/(complex permittivity) of a surface current value; and
   forming a third coil structure over the surface of the substrate adjacent to the second coil structure opposite the first coil structure in a plane parallel to the surface of the substrate, the third coil structure having a height greater than a skin current depth of the third coil structure defined as a depth which current reduces to 1/(complex permittivity) of a surface current value.

2. The method of claim 1, wherein the complex permittivity is defined as $$\left(1 - j\frac{\sigma}{\omega\varepsilon}\right),$$

where $\varepsilon$ is permittivity, $\omega$ is angular frequency, $\sigma$ is electrical conductivity, and j is complex conjugate.

3. The method of claim 1, further including arranging the first, second, and third coil structures in rounded or polygonal pattern horizontally across the substrate with a substantially flat vertical profile.

4. The method of claim 1, wherein the first and second coil structures are coupled by mutual inductance, and the second and third coil structures are coupled by mutual inductance.

5. A method of forming a semiconductor device, comprising:
   providing a substrate;
   forming a first coil structure over the substrate, the first coil structure having a height greater than a skin current depth of the first coil structure defined as a depth which current reduces to 1/(complex permittivity) of a surface current value;
   forming a second coil structure over the substrate adjacent to the first coil structure, the second coil structure having a height greater than a skin current depth of the second coil structure defined as a depth which current reduces to 1/(complex permittivity) of a surface current value; and
   forming a third coil structure over the substrate adjacent to the second coil structure, the third coil structure having a height greater than a skin current depth of the third coil structure defined as a depth which current reduces to 1/(complex permittivity) of a surface current value,
   wherein a first end of the first coil structure is placed 90 degrees from a first end of the second coil structure, and the first end of the second coil structure is placed 90 degrees from a first end of the third coil structure.

6. The method of claim 5, wherein a second end of the first coil structure is placed 90 degrees from a second end of the second coil structure, and the second end of the second coil structure is placed 90 degrees from a second end of the third coil structure.

7. A method of forming a semiconductor device, comprising:
   providing a substrate having a surface;
   forming a first coil structure over the surface of the substrate, the first coil structure having a height greater than a skin current depth of the first coil structure defined as a depth which current reduces to 1/(complex permittivity) of a surface current value; and
   forming a second coil structure over the surface of the substrate adjacent to the first coil structure in a plane parallel to the surface of the substrate, the second coil structure having a height greater than a skin current depth of the second coil structure defined as a depth which current reduces to 1/(complex permittivity) of a surface current value.

8. The method of claim 7, further including forming a third coil structure over the substrate adjacent to the second coil structure, the third coil structure having a height greater than a skin current depth of the third coil structure.

9. The method of claim 7, wherein the skin current depth of the first and second coil structures is defined as a depth which current reduces to 1/(complex permittivity) of a surface current value.

10. The method of claim 9, wherein the complex permittivity is defined as $$\left(1 - j\frac{\sigma}{\omega\varepsilon}\right),$$

where $\varepsilon$ is permittivity, $\omega$ is angular frequency, $\sigma$ is electrical conductivity, and j is complex conjugate.

11. The method of claim 7, wherein the first and second coil structures are copper with the height greater than 5 micrometers.

12. The method of claim 7, further including arranging the first and second coil structures in rounded or polygonal pattern horizontally across the substrate with a substantially flat vertical profile to produce a mutual inductance between the first and second coil structures.

13. A method of forming a semiconductor device, comprising:
    providing a substrate;
    forming a first coil structure over the substrate, the first coil structure having a height greater than a skin current depth of the first coil structure; and
    forming a second coil structure over the substrate adjacent to the first coil structure, the second coil structure having a height greater than a skin current depth of the second coil structure, wherein a first end of the first coil structure is placed 90 degrees from a first end of the second coil structure.

14. The method of claim 13, wherein a second end of the first coil structure is placed 90 degrees from a second end of the second coil structure, and the second end of the second coil structure is placed 90 degrees from a second end of the third coil structure.

15. A method of forming a semiconductor device, comprising:

provide a substrate;

forming a first coil structure over the substrate;

forming a second coil structure over the substrate adjacent to the first coil structure, wherein a first end of the first coil structure is placed 90 degrees from a first end of the second coil structure; and forming a third coil structure over the substrate adjacent to the second coil structure, wherein the first end of the second coil structure is placed 90 degrees from a first end of the third coil structure.

16. The method of claim 15, wherein a second end of the first coil structure is placed 90 degrees from a second end of the second coil structure, and the second end of the second coil structure is placed 90 degrees from a second end of the third coil structure.

17. The method of claim 15, wherein the first and second coil structures have a height greater than a skin current depth of the first coil structure.

18. The method of claim 17, wherein the skin current depth of the first and second coil structures is defined as a depth which current reduces to 1/(complex permittivity) of a surface current value.

19. The method of claim 18, wherein the complex permittivity is defined as $$\left(1 - j\frac{\sigma}{\omega\varepsilon}\right),$$

where $\varepsilon$ is permittivity, $\omega$ is angular frequency, $\sigma$ is electrical conductivity, and j is complex conjugate.

20. A semiconductor device, comprising:

a substrate having a surface;

a first coil structure formed over the surface of the substrate, the first coil structure having a height greater than a skin current depth of the first coil structure defined as a depth which current reduces to 1/(complex permittivity) of a surface current value; and a second coil structure formed over the surface of the substrate adjacent to the first coil structure in a plane parallel to the surface of the substrate, the second coil structure having a height greater than a skin current depth of the second coil structure defined as a depth which current reduces to 1/(complex permittivity) of a surface current value.

21. The semiconductor device of claim 20, wherein a first end of the first coil structure is placed 90 degrees from a first end of the second coil structure.

22. The semiconductor device of claim 20, wherein the skin current depth of the first and second coil structures is defined as a depth which current reduces to 1/(complex permittivity) of a surface current value.

23. The semiconductor device of claim 22, wherein the complex permittivity is defined as $$\left(1 - j\frac{\sigma}{\omega\varepsilon}\right),$$

where $\varepsilon$ is permittivity, $\omega$ is angular frequency, $\sigma$ is electrical conductivity, and j is complex conjugate.

24. The semiconductor device of claim 20, wherein the first and second coil structures are arranged in rounded or polygonal pattern horizontally across the substrate with a substantially flat vertical profile to produce a mutual inductance between the first and second coil structures.

* * * * *